United States Patent [19]

Sparks

[11] Patent Number: 5,469,105
[45] Date of Patent: Nov. 21, 1995

[54] TRANSMITTER AND POWER AMPLIFIER THEREFOR

[75] Inventor: Geoffrey S. Sparks, Cambridge, England

[73] Assignee: U.S. Philips Corporation, New York, N.Y.

[21] Appl. No.: 290,410

[22] Filed: Aug. 15, 1994

[30] Foreign Application Priority Data

Aug. 13, 1993 [GB] United Kingdom ............... 9316869

[51] Int. Cl.$^6$ .................................................. H03G 3/20
[52] U.S. Cl. ............................................ 330/129; 455/126
[58] Field of Search .................................. 330/129, 130, 330/131, 132, 149; 455/126

[56] References Cited

U.S. PATENT DOCUMENTS

| | | | |
|---|---|---|---|
| 4,563,775 | 1/1986 | Yokosuka | 455/126 |
| 5,066,923 | 11/1991 | Gailus et al. | 330/129 X |
| 5,126,686 | 6/1992 | Tam | 330/134 |
| 5,170,495 | 12/1992 | McNicol et al. | 455/126 X |

FOREIGN PATENT DOCUMENTS

| | | |
|---|---|---|
| 0446073 | 9/1991 | European Pat. Off. . |
| 0527029 | 2/1993 | European Pat. Off. . |
| 2220808 | 1/1990 | United Kingdom . |

*Primary Examiner*—Steven Mottola
*Attorney, Agent, or Firm*—Michael J. Balconi-Lamica; Laurie E. Gathman

[57] ABSTRACT

A transmitter comprises a linearized power amplifier circuit consisting of a power amplifier output stage having a feedback loop connected between its output and input. The feedback loop includes a coupler, a first gain control element and a feedback function stage which collectively determine the loop gain of the amplifier. A second gain control element is provided in the forward gain path of the power amplifier. The first and second gain control elements are controlled so that the product of their gains is constant. As a result the loop parameters remain substantially constant as the power setting is varied.

9 Claims, 1 Drawing Sheet

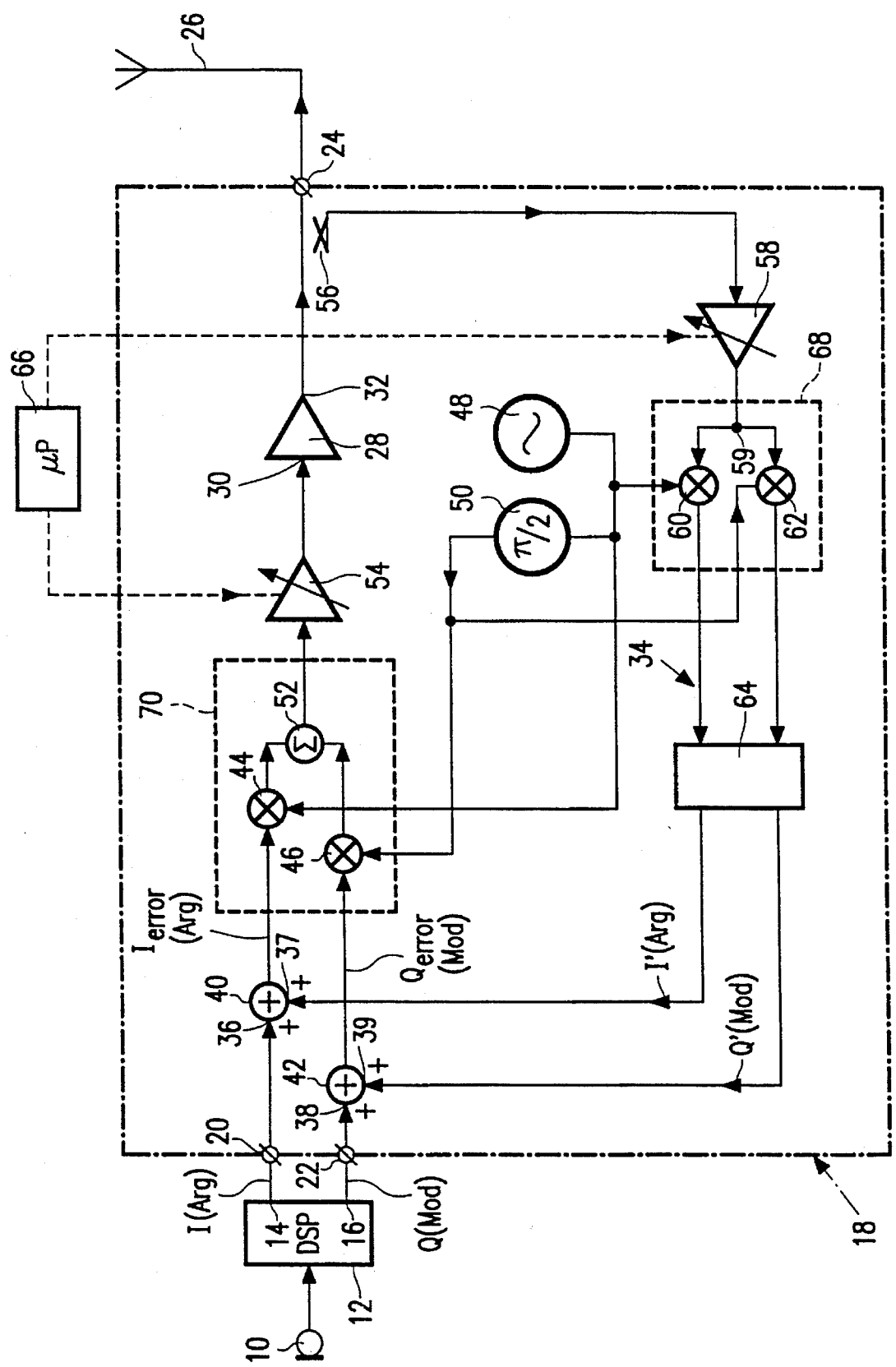

TRANSMITTER AND POWER AMPLIFIER THEREFOR

BACKGROUND OF THE INVENTION

1. Field of the Invention

The present invention relates to a transmitter or a transmitter part of a transceiver and more particularly to the power control of a transmitter power amplifier.

2. Description of the Prior Art

Recent developments in cellular telephones has stimulated interest in power control of a transmitter power amplifier because in an attempt to reduce interference and economise on battery power, output powers are regulated to be sufficient for a receiving station to obtain an acceptable signal. A typical transmitter power amplifier control circuit is disclosed in British Patent Specification GB-A-2 220 808 and comprises a power amplifier having an input, an output and a gain control input, a directional coupler couples out a portion of the amplifier's output signal and applies it generally as a dc representation of the output to one input of a comparator to a second input of which is applied a locally generated reference power waveform, an output from the comparator is applied to the gain control input of the power amplifier. The gain control input normally controls the supply voltage of the power amplifier. This type of power amplifier control is normally applied because the amplifier architecture does not normally have overall feedback. In fact in the interests of amplifier stability, feedback is avoided in general practice because the frequencies are high.

In certain applications, for example TDMA digital trunking systems, a linear power amplifier with a good overall efficiency is required. Typically in private mobile radio non-linear (class C) amplifiers are used which are unsuitable for digital trunking systems. A known type of linear power amplifier architecture is a Cartesian loop amplifier in which an input signal is represented by orthogonal vectors I (in-phase) and Q (quadrature phase). Another known type of linear power amplifier is a polar loop amplifier.

SUMMARY OF THE INVENTION

An object of the present invention is to linearise an amplifier by means of a Cartesian loop or polar loop architecture.

According to one aspect of the present invention there is provided a transmitter having a linearised-power amplifier circuit comprising a forward gain path including a power amplifier output stage having an input and an output and a feedback loop coupled between said output and input, the feedback loop including means for deriving a portion of the power amplifier output stage's output and a feedback function stage, means for combining an output of the feedback loop with a representation of a modulating signal, a first gain control element in the forward gain path of the power amplifier output stage and a second gain control element in the feedback loop.

According to a second aspect of the present invention there is provided a power amplifier circuit comprising an input for an external signal, a forward gain path including a power amplifier output stage having a signal input and a signal output, a feedback loop coupled between said signal output and signal input, the feedback loop including means for deriving a portion of the power amplifier output stage's output and a feedback function stage, means for combining an output of the feedback loop with an external signal applied to said input, a first gain control element in said forward gain path and a second gain control element in the feedback loop and means for controlling the first and second gain control elements such that the product of their gains remains substantially constant.

In an embodiment of the power amplifier circuit, means are provided for controlling the first and second gain control elements such that the product of their gains remains substantially constant.

By means of the present invention the power amplifier circuit has a method of power control which is compatible with the closed feedback loop structure. The power setting is varied by adjusting the gains of the components in the feedback loop but the loop parameters remain constant by virtue of adjusting the first gain control element to maintain the product of the gains of the first and second control elements so that it is substantially constant.

The power amplifier circuit may have a Cartesian loop architecture or a polar loop architecture.

BRIEF DESCRIPTION OF THE DRAWINGS

The present invention will now be described, by way of example, with reference to the single FIGURE of the accompanying drawing, which FIGURE is a block schematic diagram of an embodiment of a transmitter made in accordance with the present invention.

DETAILED DESCRIPTION OF THE PREFERRED EMBODIMENTS

In the interests of clarity the embodiment of the invention will be described with reference to a Cartesian loop architecture being used to linearise a power amplifier. Subsequently reference will be made to those changes which are required when a polar loop architecture is used.

A source of modulating signals, such as a microphone 10, is applied to means, such as a digital signal processor (DSP) 12, for producing quadrature related versions I, Q of the modulating signal on respective outputs 14,16. A linearised power amplifier circuit 18 has inputs 20,22 coupled to the outputs 14,16, respectively, and an output 24 coupled to an antenna 26.

The power amplifier circuit 18 comprises a power amplifier output stage 28 having an input 30 and an output 32. The stage 28 is a class A/B amplifier having 50 dB of gain, for example a Motorola MHW926 Power Module. A feedback loop B4 is provided by means of loop components 56,58, 68,64,40,42,70 and 54 between the output 32 of the power amplifier output stage 28 and its input 30.

The I and Q signals on the inputs 20,22 are applied to first inputs 36,38 of a pair of summing junctions 40,42 which have second inputs 37,39 connected to receive the quadrature related components I',Q' from the feedback loop 34. Outputs of the summing junctions 40,42 are connected to a block 70 for obtaining a representation of the carrier vector. The block 70 includes respective frequency up converters comprising mixers 44,46. The transmitter or channel frequency from a master oscillator 48 is applied to the mixer 44 and a 90 degree phase shifted version of this frequency is applied to the mixer 46 by a π/2 radians phase shifter 50 connected to the oscillator 48. Outputs of the mixers 44,46 are summed in a summing stage 52 which provides the carrier vector on its output. A first gain control element 54 is connected in the forward gain path between the output of the summing stage 52 and the input 30 of the power amplifier output stage 28.

The feedback loop 34 comprises a coupler 56 which couples out a portion of the transmitter output signal which is applied to a second gain control element 58. The output from the element 58 is applied to a block 68 for deriving the baseband representation of the signal at the output of said element. The block 68 comprises a power splitter 59 and a frequency down conversion stage comprising mixers 60,62 to which are connected outputs of the master oscillator 48 and the phase shifter 50, respectively. Outputs from the mixers 60,62 are quadrature related base band signals. These signals are applied to a feedback function stage 64 which produces the I' and Q' signals which are applied to the summing junctions 40,42.

The first and second gain control elements 54,58 are controlled by a processor 66 so that their gains are varied inversely, that is the product $G_{54} \cdot G_{58}$ is constant (where $G_{54}$ and $G_{58}$ are the gains of elements 54,58), which enables the feedback loop 34 to be optimised so that it always works at a fixed level irrespective of the actual output power applied to the antenna 26. By classical control theory the overall gain of the loop is defined as:

$$\text{Loop Gain} = \frac{G_{28} \cdot G_{54}}{1 + G_{28} \cdot G_{54}(G_{56} \cdot G_{58} \cdot G_{64})} \approx$$

$$\frac{1}{G_{56} \cdot G_{58} \cdot G_{64}} \text{ when } G_{28} \cdot G_{54}(G_{56} \cdot G_{58} \cdot G_{64}) \gg 1$$

More particularly the second gain control element 58 in the feedback gain path controls the power level at the antenna 26 and the first gain control element 54 in the forward gain path is adjusted to maintain the loop gain at its design level. The effect of the element 54 is to maintain loop stability and has no effect on the overall amplifier gain as indicated by the above equation. As a result the signal level at the input of the element 54 remains constant as the transmitter power is varied.

For a transmitter having a polar loop architecture, the power amplifier circuit 18 has the following changes.

The output of the DSP12 comprises the argument (Arg), instead of the I signal, on the output 14 and the modulus (Mod), instead of the Q signal, on the output 16. The block 68 comprises means for providing the argument and modulus of the signal at the output of the second gain control element 58 at baseband frequencies. The argument and the modulus from the feedback function stage 64 are combined with the argument and the modulus on the outputs 14,16, respectively, of the DSP12 in summing junctions 40,42. The block 70 comprises means for combining and frequency up-converting the argument and modulus into a carrier signal for application to the first gain control element 54. Otherwise the circuit is as described with respect to a Cartesian loop architecture.

From reading the present disclosure, other modifications will be apparent to persons skilled in the art. Such modifications may involve other features which are already known in the design, manufacture and use of transmitters and linear power amplifiers therefor and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A transmitter having a linearised power amplifier circuit comprising a forward gain path including a power amplifier output stage having an input and an output and a feedback loop coupled between said output and input, the feedback loop including means for deriving a portion of the power amplifier output stage's output and a feedback function stage, means for combining an output of the feedback loop with a representation of a modulating signal, a first gain control element in the forward gain path of the power amplifier output stage and a second gain control element in the feedback loop, and means for controlling the first and the second gain control elements such that the product of their gains remains substantially constant.

2. A transmitter as claimed in claim 1, characterised in that the linearised power amplifier circuit has a Cartesian loop architecture, in that there are provided means for producing orthogonal vectors of the modulating signal and means for producing orthogonal vectors of the signal in the feedback loop and in that the combining means combines corresponding vectors of the modulating signal and the feedback signal to produce respective in-phase and quadrature vectors.

3. A transmitter as claimed in claim 2, characterised in that there are provided means for frequency up-converting the in-phase and quadrature vectors and means for combining the in-phase and quadrature vectors to produce a carrier vector which is applied to the forward gain path, and in that the means for producing orthogonal vectors of the signal in the feedback loop includes means for producing said orthogonal vectors at baseband frequencies.

4. A transmitter as claimed in claim 1, characterised in that the linearised power amplifier circuit has a polar loop architecture, in that there are provided means for producing modulus and argument vectors of the modulating signal and means for producing modulus and argument vectors of the signal in the feedback loop and in that the combining means combines corresponding vectors of the modulating signal and the feedback signal to produce respective modulus and argument vectors.

5. A transmitter as claimed in claim 4, characterised in that there are provided means for frequency up-converting the modulus and argument vectors and means for combining the modulus and argument vectors to produce a carrier vector which is applied to the forward gain path of the power amplifier, and in that the means for producing polar vectors of the signal in the feedback loop includes means for producing said polar vectors at baseband frequencies.

6. A transmitter as claimed in claim 1, characterised in that the first gain control element is connected to the input of the power amplifier output stage.

7. A transmitter as claimed in claim 1, characterised in that the second gain control element is connected to the means for deriving a portion of the power amplifier output stage's output.

8. A power amplifier circuit comprising an input for an external signal, a forward gain path including a power amplifier output stage having a signal input and a signal output, a feedback loop coupled between said signal output and signal input, the feedback loop including means for deriving a portion of the power amplifier output stage's output and a feedback function stage, means for combining an output of the feedback loop with an external signal applied to said input, a first gain control element in said forward gain path and a second gain control element in the feedback loop and means for controlling the first and second gain control elements such that the product of their gains remains substantially constant.

9. A power amplifier circuit as claimed in claim 8, characterised in that the first gain control element is connected to the input of the power amplifier output stage and in that the second gain control element is connected to the means for deriving a portion of the power amplifier output stage's output.

* * * * *